United States Patent
Hanazaki (10) Patent No.: US 9,048,549 B2
(45) Date of Patent: Jun. 2, 2015

(54) WIRE CONNECTING DEVICE FOR CONNECTING FIBER-CORE CONDUCTOR

(75) Inventor: Hisashi Hanazaki, Makinohara (JP)

(73) Assignee: Yazaki Corporation, Tokyo (JP)

( * ) Notice: Subject to any disclaimer, the term of this patent is extended or adjusted under 35 U.S.C. 154(b) by 182 days.

(21) Appl. No.: 13/820,827

(22) PCT Filed: Sep. 15, 2011

(86) PCT No.: PCT/JP2011/071762
§ 371 (c)(1),
(2), (4) Date: Mar. 5, 2013

(87) PCT Pub. No.: WO2012/043422
PCT Pub. Date: Apr. 5, 2012

(65) Prior Publication Data
US 2013/0175089 A1    Jul. 11, 2013

(30) Foreign Application Priority Data

Sep. 28, 2010  (JP) ................. 2010-216768

(51) Int. Cl.
*H01R 4/00* (2006.01)
*H01R 4/06* (2006.01)
*H01B 7/00* (2006.01)
*H05K 3/32* (2006.01)

(52) U.S. Cl.
CPC .. *H01R 4/06* (2013.01); *H01B 7/00* (2013.01); *H05K 3/325* (2013.01); *H05K 2201/10287* (2013.01); *H05K 2201/10295* (2013.01)

(58) Field of Classification Search
USPC ........ 174/36, 74 R, 77 R, 250–252; 439/441, 439/888, 874, 877
See application file for complete search history.

(56) References Cited

U.S. PATENT DOCUMENTS 6,827,613 B2 * 12/2004 Ferderer ................. 439/805
7,536,754 B2 *  5/2009 Campbell et al. ........ 24/265 R
(Continued)

FOREIGN PATENT DOCUMENTS

DE    19517496 A1    11/1996
EP     0586283 A1     3/1994
(Continued)

OTHER PUBLICATIONS

International Search Report dated Oct. 18, 0211, issued for PCT/JP2011/071762.
(Continued)

*Primary Examiner* — William H Mayo, III
(74) *Attorney, Agent, or Firm* — Locke Lord LLP; James E. Armstrong, IV; George N. Chaclas (57) ABSTRACT

A wire connecting device for connecting a fiber-core conductor configured by stranding a plurality of fiber-core conductive wires. The wire connecting device includes a vis having a rod-shape pin and a head extending outwardly from the pin. A plate-shape terminal connects with the vis by inserting the pin in an opening. The head matches up with an overlap portion of the terminal so that the fiber-core conductor is clamped between the head and the overlap portion of the terminal connect electrically the fiber-core conductor and the terminal. The conductor passes over and contacts an end portion of the pin. The pin and the inner surface of the opening are curved surfaces to eliminate sharp corners.

6 Claims, 5 Drawing Sheets

(56) References Cited

U.S. PATENT DOCUMENTS

2003/0019661 A1* 1/2003 Aoyama et al. ............ 174/126.1
2008/0066306 A1* 3/2008 Bernardini ...................... 29/877

FOREIGN PATENT DOCUMENTS

| IE | 34672 B | 7/1975 |
|---|---|---|
| JP | 58779 Z1 | 8/1921 |
| JP | 56-20282 U | 2/1981 |
| JP | 2000-114115 A | 4/2000 |
| JP | 2010-140807 A | 6/2010 |
| JP | 2010-153187 A | 7/2010 |

OTHER PUBLICATIONS

Supplementary European Search Report dated Mar. 6, 2014, issued for the European patent application No. 11828978.4.

* cited by examiner

WIRE CONNECTING DEVICE FOR CONNECTING FIBER-CORE CONDUCTOR

TECHNICAL FIELD

This invention relates to a wire connecting device for connecting a fiber-core conductor configured by stranding a plurality of fiber-core conductive wires, which are formed by plating a surface of a fiber with electric conductive metal, and a terminal to be connected electrically with the fiber-core conductor.

BACKGROUND ART

A major usual electric wire includes a core wire configured by stranding a plurality of cupper wires. Instead of the electric wire including cupper wires as the core wire, a fiber-core electric wire including a fiber-core conductor as a core wire, which is configured by stranding a plurality of fiber conductive wires formed by plating a surface of a fiber with electric conductive metal such as cupper, is proposed for reducing its weight, and improving tensile strength and bendability of the wire.

Figure 7:
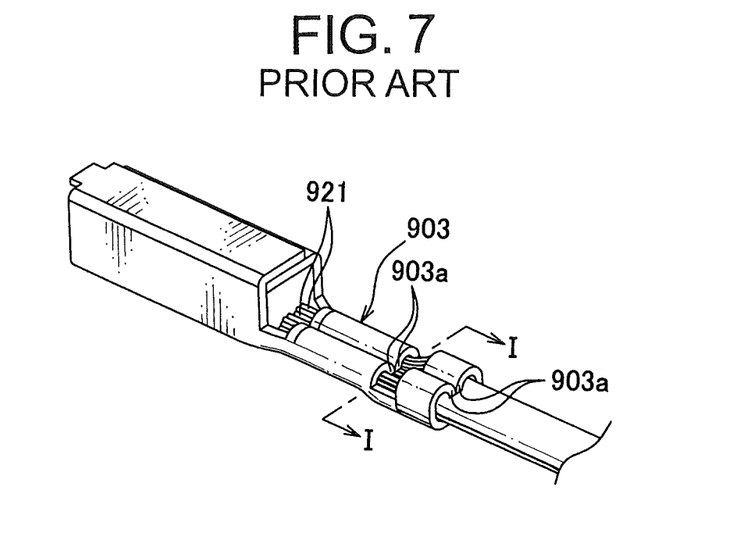
FIG. 7 is a perspective view showing a wire connecting device for connecting a fiber-core conductor by prior art.
Figure 8:
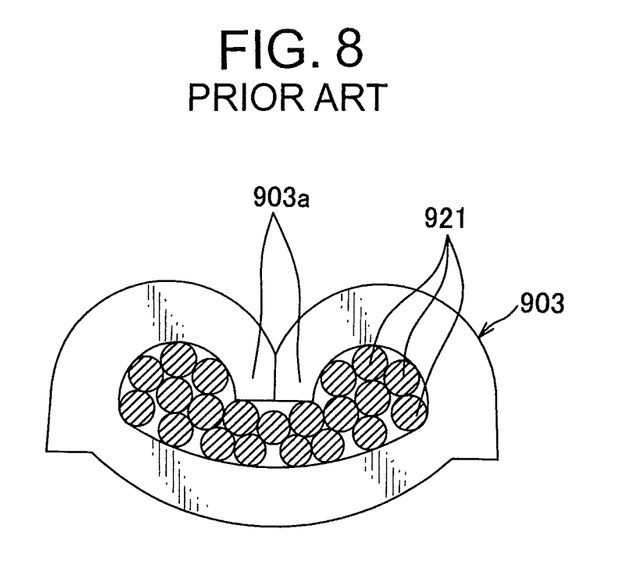
FIG. 8 is a cross-sectional view taken along the line I-I shown in FIG. 7.

As a method for connecting an end top of such fiber-core conductor and a terminal, a method for crimping the fiber-core conductor with the terminal 903 may be considerable, similarly as a method for usual electric conductive wires 921 as shown in FIGS. 7 and 8 (see Patent Document 1).

The fiber-core electric wire has large tensile strength, however, has small shearing strength because each of the fiber-core conductive wires is very thin. By the usual method for crimping, shearing stress by a crimping piece (edge) 903a of the terminal 903 is loaded partially on the fiber-core conductive wires in a shearing direction. Thereby, the fiber-core conductive wires may be broken when crimping operation.

CITATION LIST

Patent Document 1: Japan Patent Publication Application No. 2010-140807

SUMMARY OF INVENTION

Objects to be Solved

According to the above problems, an object of the present invention is to provide a wire connecting device for connecting a fiber-core conductor, which can improve reliability of electrical connection by controlling a load in a shearing direction on the fiber-core conductor.

How to Attain the Object of the Present Invention

In order to overcome the above problems and attain the object, the present invention described in claim 1 is to provide a wire connecting device for connecting a fiber-core conductor configured by stranding a plurality of fiber-core conductive wires, which are formed by plating a surface of a fiber with electric conductive metal; the wire connecting device including a vis having a rod-shape pin and a head extending outwardly from the pin to be mounted at an end portion of the fiber-core conductor; and a plate-shape terminal connected with the vis, and having an opening, which the pin is inserted through, and an overlap portion, which is arranged at the terminal and the head is overlapped on; and the fiber-core conductor being clamped between the overlap portion and the head so as to connect electrically the fiber-core conductor and the terminal.

The wire connecting device according to claim 2 is characterized in that a portion formed into a ring shape of the fiber-core conductor is clamped between the overlap portion and the head.

The wire connecting device according to claim 3 is characterized in that the fiber-core conductor is clamped between the head and the overlap portion of the terminal so as to be passed over an end portion of the pin, which is a far side from the head, and one of a first area having the pin and the end portion, and a second area having the overlap portion and an inner surface of the opening are formed into a curved surface so as to eliminate a sharp corner.

The wire connecting device according to claim 4 is characterized in that in condition that the fiber-core conductor is clamped between the overlap surface and the head, an end portion of the pin, which is a far side from the head, is pressed and formed into a second head by pressing so as to prevent the pin from dropping through from the opening.

Effects of the Invention

According to the present invention described in claim 1, the wire connecting device for connecting the fiber-core conductor configured by stranding the plurality of fiber-core conductive wires, which are formed by plating the surface of the fiber with electric conductive metal, includes the vis having the rod-shape pin and the head extending outwardly from the pin to be mounted at the end portion of the fiber-core conductor; and the plate-shape terminal connected with the vis, and having the opening, which the pin is inserted through, and the overlap portion, which is arranged at the terminal and the head is overlapped on; and the fiber-core conductor is clamped between the overlap portion and the head so as to connect electrically the fiber-core conductor and the terminal. Thereby, each face of the overlap portion and the head contacts to each other, and the fiber-core conductor is clamped between the faces thereof. Therefore, a force in a shearing direction loaded on the fiber-core conductor is controlled. The wire connecting device for connecting the fiber-core conductor, which improves reliability of electrical connection between the fiber-core conductor and the terminal, can be provided.

According to the wire connecting device claimed in claim 2, the portion formed into a ring shape of the fiber-core conductor is clamped between the overlap portion and the head. Thereby, the fiber-core conductor is wound around the pin, and when the fiber-core conductor is pulled along a lengthwise direction of the fiber-core conductor, the fiber-core conductor is not pulled out from a gap between the overlap portion and the head. Therefore, reliability of electrical connection between the fiber-core conductor and the terminal can be more improved.

According to the wire connecting device claimed in claim 3, the fiber-core conductor is clamped between the head and the overlap portion of the terminal so as to be passed over the end portion of the pin, which is the far side from the head, and one of the first area having the pin and the end portion, and the second area having the overlap portion and the inner surface of the opening are formed into the curved surface so as to eliminate a sharp corner. Thereby, a force in the shearing direction loaded on the fiber-core conductor is more controlled. Therefore, reliability of electrical connection between the fiber-core conductor and the terminal can be more improved.

According to the wire connecting device claimed in claim 4, in condition that the fiber-core conductor is clamped between the overlap surface and the head, an end portion of the pin, which is a far side from the head, is pressed and formed into a second head by pressing so as to prevent the pin from dropping through from the opening. Thereby, the vis is formed as a rivet integrally with the terminal so as to connect tightly the fiber-core conductor and the terminal (that is the fiber-core conductor and the terminal are riveted together). Thus, the fiber-core conductor clamped between the rivet and the terminal is semi permanently connected with the terminal. Therefore, reliability of electrical connection between the fiber-core conductor and the terminal can be more improved.

DESCRIPTION OF EMBODIMENTS

A wire connecting device for connecting a fiber-core conductor as a first embodiment according to the present invention is described with reference to drawings FIGS. 1-4.

Figure 1:
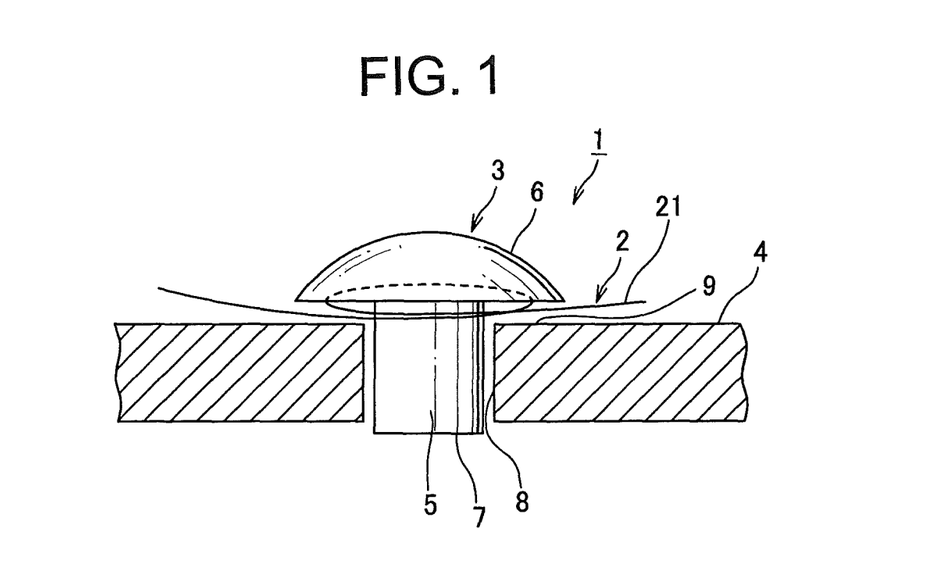
FIG. 1 is an illustration by modeling showing a wire connecting device for connecting a fiber-core conductor of an embodiment according to the present invention.

The wire connecting device 1, as shown in FIG. 1, includes an electric wire 2 having a fiber-core conductor 21, a rivet 3 as a vis having a rod-shape pin 5 joined with an end of the electric wire 2 and a head 6 extending outwardly from the pin 5, and a plate-shape terminal 4 having an opening 8, which the pin 5 is inserted through. An arrow K shown in FIG. 3 (FIG. 5) shows a direction, in which the pin 5 is inserted through the opening 8.

Figure 2A:
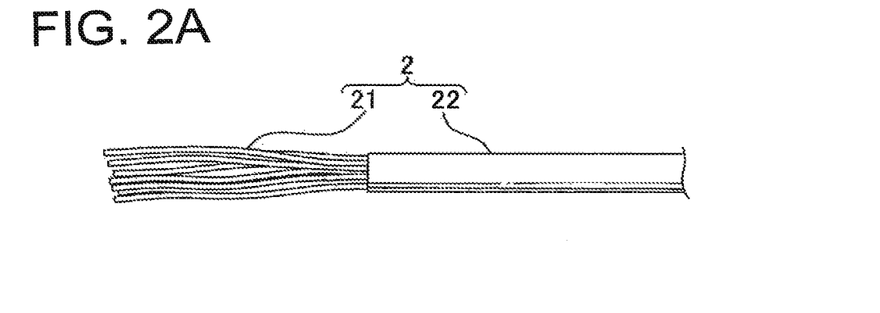
FIG. 2A is a side view of the fiber-core conductor shown in FIG. 1.
Figure 2B:
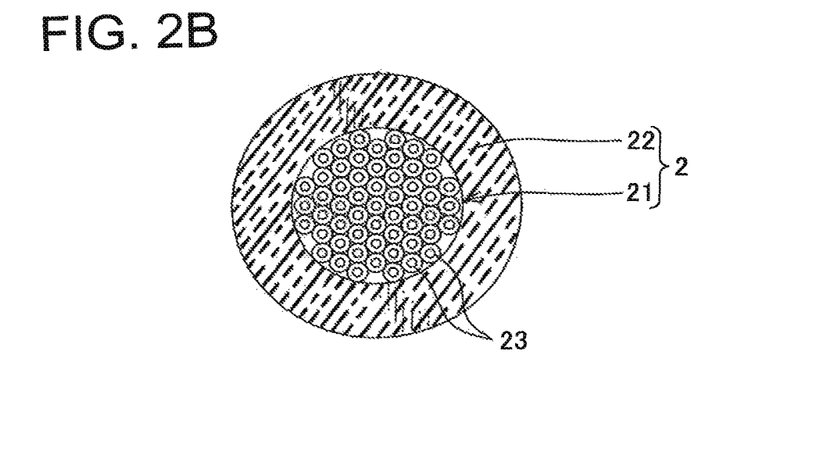
FIG. 2B is a front view of the fiber-core conductor shown in FIG. 2A.
Figure 2C:
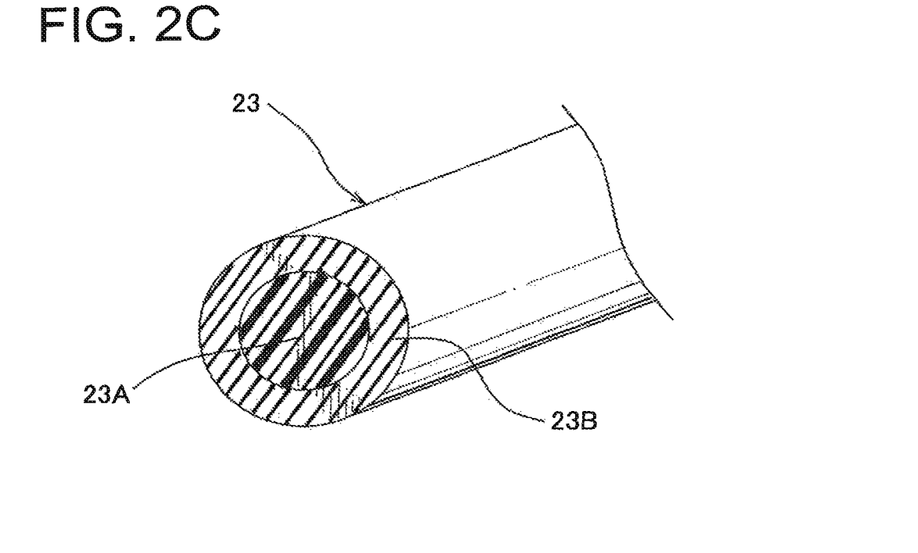
FIG. 2C is a perspective view of the fiber-core conductor shown in FIG. 2B.

The electric wire 2 structures a wiring harness wired in a car as a mobile body. The electric wire 2 includes an electric conductive fiber-core conductor 21 and an insulation cover 22. The fiber-core conductor 21 is formed by stranding a plurality of fiber-core conductive wires 23. The fiber-core conductive wire 23 is structured by a fiber 23A made of resin such as para-aramide and polyarylate, and cupper 23B as electric conductive metal plated on a surface of the fiber 23A.

In the embodiment, the cupper 23B is applied for the conductive metal, but the present invention is not limited in above embodiments. Any metal, which can be plated on the fiber 23, may be applied. Chemical fiber made of resin is applied for the fiber 23A, but the present invention is not limited in above embodiments. For example, natural fiber can be used.

The rivet 3 is formed with an electric conductive metal.

Figure 3A:
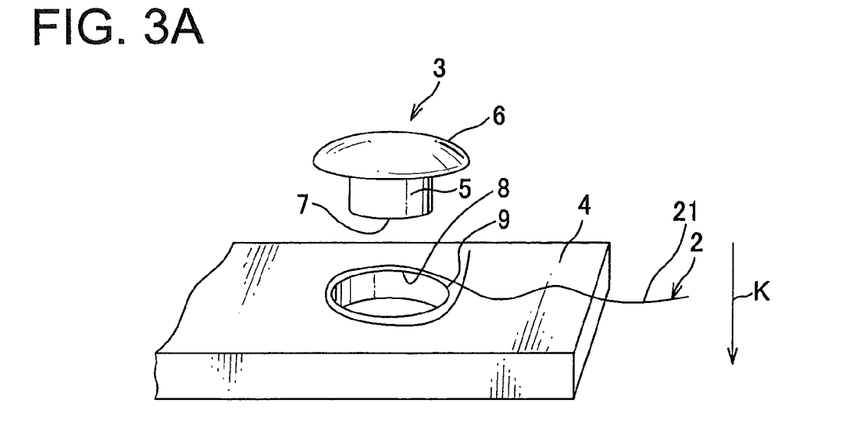
FIG. 3A is an illustration showing a condition of connecting the fiber-core conductor shown in FIG. 2A and a terminal.
Figure 3B:
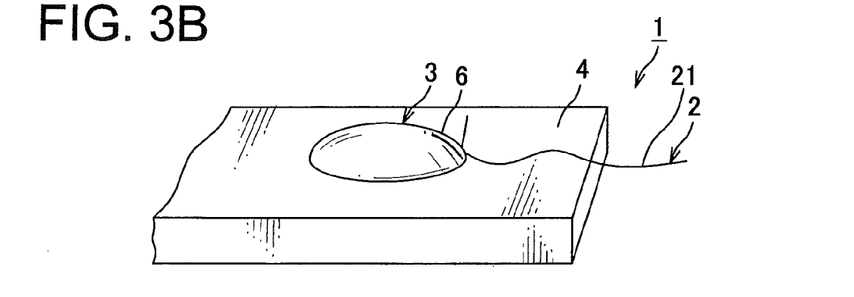
FIG. 3B is an illustration showing a condition of the fiber-core conductor connected with the terminal shown in FIG. 3A.

The terminal 4 includes an opening 8, which passes through the terminal 4 and the pin 5 is inserted through, as shown in FIG. 3. The terminal 4 also includes an overlap portion 9, on which the head overlaps when the pin 5 is inserted through the opening 8. The overlap portion 9 is formed flat so as to overlap with an overlap surface of the head 6 without gap. In other word, the overlap portion 9 and the overlap surface of the head 6 abut on each other by surface contact.

Figure 4:
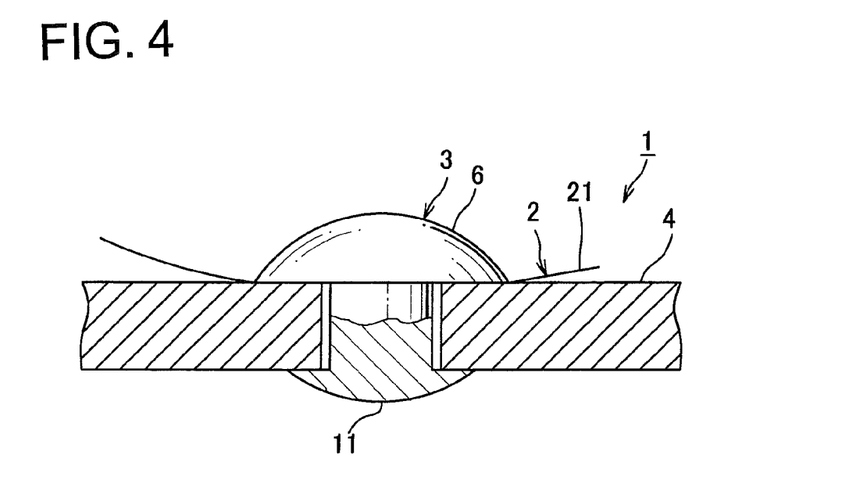
FIG. 4 is an illustration by modeling showing a condition that an end portion of a pin is pressed after the fiber-core conductor and the terminal are connected.

A method for assembling the wire connecting device 1 for connecting a fiber conductor will be described with reference to FIGS. 3 and 4. First, the cover 22 of the electric wire 2 is stripped, and thereby, the fiber-core conductor 21 is exposed. The exposed fiber-core conductor 21 is curved so as to form a ring portion as shown in FIG. 3A, and the ring portion formed by the fiber-core conductor 21 is placed at the overlap portion 9. The rivet 3 is moved nearer to the terminal 4, and the pin 5 is inserted along the arrow K through the opening 8 so as to clamp the ring portion between the terminal 4 (the overlap portion 9) and the head 6 (shown in FIG. 3B). Thus, the electric wire 2 (fiber-core conductor 21) and the terminal 4 are electrically connected.

Thereafter, in condition that the ring portion is clamped between the terminal 4 (overlap portion 9) and the head 6, and the pin 5 of the rivet 3 is inserted through the opening 8 of the terminal 4, the head 6 is pressed to the terminal 4. In that condition, an end portion 7 of the pin 5, which is a far side from the head 6, is pressed toward the terminal 4 by punching. Thereby, as shown in FIG. 4, a second head 11 is formed so as to prevent the pin 5 from falling out of the opening 8, and the rivet 3 and the terminal 4 are formed integrally by pressing the end portion 7. Thus, since the rivet 3 and the terminal 4 are integrated, the fiber-core conductor 21 and the terminal 4 can be connected more tightly by the rivet 3 (in other words, by rivet connection). Thus, the wire connecting device 1 for connecting a fiber-core conductor is assembled.

According to the above embodiment, the wire connecting device 1 for connecting the fiber-core conductor 21 configured by stranding the plurality of fiber-core conductive wires, which are formed by plating the surface of the fiber with electric conductive metal, includes the rivet 3 as a vis having the rod-shape pin 5 and the head 6 extending outwardly from the pin 5 to be mounted at an end portion of the fiber-core conductor 21; and the plate-shape terminal 4 having the opening 8, which the pin 5 is inserted through and the rivet 3 is connected with, and the overlap portion 9, which is arranged at the terminal 4 the head 6 is overlapped on. And the fiber-core conductor 21 is clamped between the head 6 and the overlap portion 9 of the terminal 4, so that the fiber-core conductor and the terminal are connected electrically. Thereby, each face of the overlap portion and the head contacts to each other, and the fiber-core conductor 21 is clamped between the faces thereof. Therefore, a force in a shearing direction loaded on the fiber-core conductor 21 is controlled. The wire connecting device 1 for connecting the fiber-core conductor, which improves reliability of electrical connection between the fiber-core conductor 21 and the terminal 4, can be provided.

The portion formed into a ring shape of the fiber-core conductor 21 is clamped between the overlap portion 9 and the head 6. Therefore, when the fiber-core conductor is pulled in a lengthwise direction of the fiber-core conductor 21, the fiber-core conductor 21 is wound around the pin 5, so that the fiber-core conductor 21 contacts the overlap portion 9 and the head 6, and is not pulled out from a gap between the overlap portion 9 and the head 6. Thereby, reliability of electrical connection between the fiber-core conductor 21 and the terminal 4 can be more improved.

In condition that the fiber-core conductor 21 is between the overlap portion 9 and the head 6, the end portion 7 of the pin 5, which is a far side from the head 6, is pressed and formed into the second head 11 by pressing so as to prevent the pin 5 from dropping through from the opening 8. By pressing the end portion 7, the rivet 3 as the vis is joined integrally with the terminal 4. Thereby, the fiber-core conductor 21 and the terminal 4 are connected more tightly by the rivet 3 (in other words, by rivet connection). Thus, the fiber-core conductor 21 clamped between the rivet 3 and the terminal 4 is connected semi-permanently with the terminal 4. Thereby, reliability of electrical connection between the fiber-core conductor 21 and the terminal 4 can be more improved.

Figure 5A:
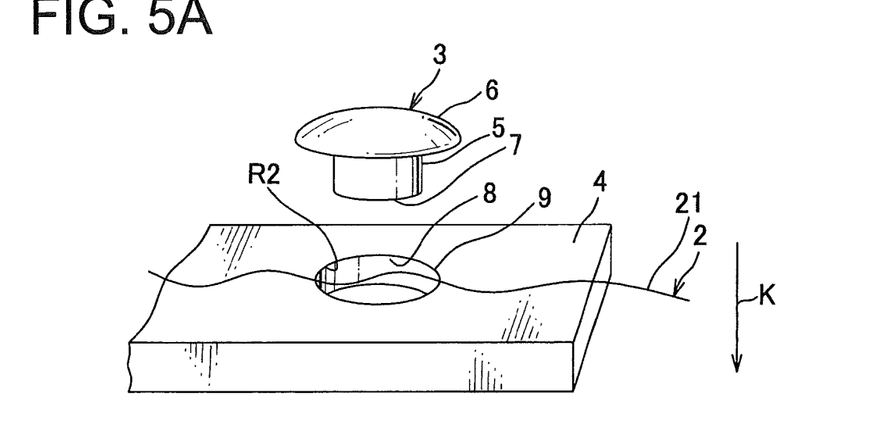
FIG. 5A is an illustration showing a condition of connecting the fiber-core conductor and the terminal structuring a second embodiment according to the present invention.
Figure 5B:
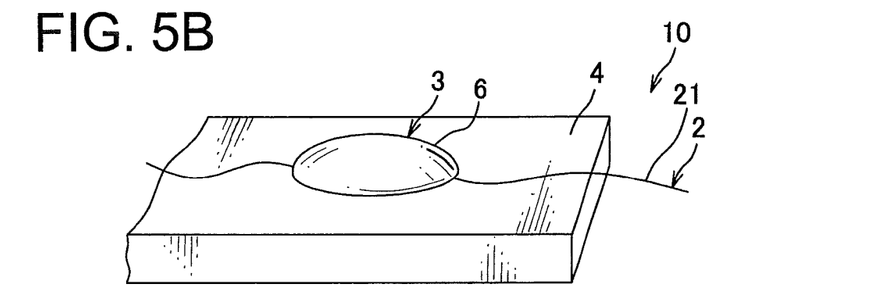
FIG. 5B is an illustration showing a condition of the fiber-core conductor connected with the terminal shown in FIG. 5A.
Figure 6:
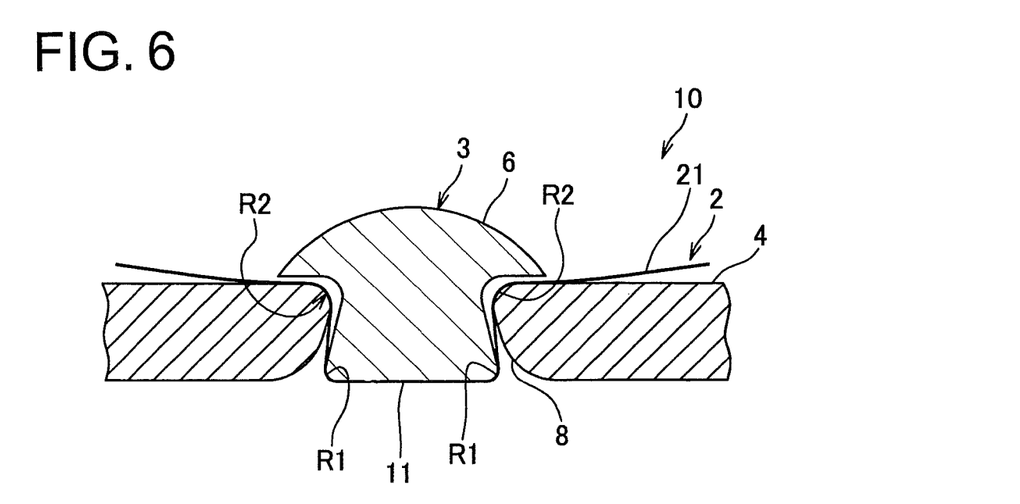
FIG. 6 is an illustration by modeling showing a condition that an end portion of a pin is pressed after the fiber-core conductor and the terminal are connected.

Second embodiment: The wire connecting device 10 for connecting a fiber-core conductor according to the second embodiment of the present invention will be described with reference to FIGS. 5 and 6. In FIGS. 5 and 6, the same components as the above embodiment are assigned with the same marking and descriptions are eliminated.

The wire connecting device 10 includes the electric wire 2 having the fiber-core conductor 21, the rivet 3 as the vis having the rod-shape pin 5 joined with the end of the electric wire 2 and the head 6 extending outwardly from the pin 5, and the plate-shape terminal 4 having the opening 8, which the pin 5 is inserted through.

The pin 5, as shown in FIG. 6, includes a first boundary area R1 between the pin 5 and the end portion 7, which is a far side from the head 6. The first boundary area R1 is curved so as to eliminate a sharp corner. In FIG. 5, the first boundary area R1 is omitted.

The terminal 4 includes a second boundary area R2 between the overlap portion 9 and the inner surface of the opening 8. The second boundary area R2 is curved so as to eliminate a sharp corner.

A method for assembling the wire connecting device 1 for connecting a fiber conductor will be described with reference to FIGS. 5 and 6. First, the cover 22 of the electric wire 2 is stripped, and thereby, the fiber-core conductor 21 is exposed. Thereafter, the exposed fiber-core conductor 21 is arranged on the surface of the terminal so as to traverse the opening 8 along a direction intersecting the direction shown by the arrow K, as shown in FIG. 5A. The rivet 3 is approached to the terminal 4 and the pin 5 is inserted into the opening 8 along the direction shown by the arrow K. Thereby, the fiber-core conductor 21 is led from a gap between the head 6 and the overlap portion 9 (terminal 4) through a gap between the pin 5 and an inner surface of the opening 9, and over the end portion 7 of the pin 5, and through the pin 5 and the inner surface of the opening 8, and through the gap between the head 6 and the overlap portion 9. In the condition, the fiber-core conductor 21 is clamped between the rivet 3 and the terminal 4, as shown in FIG. 5B. In the condition, the fiber-core conductor 21 is forced along the direction shown by the lengthwise direction of the fiber-core conductor 21. The first boundary area R1 and the second boundary area R2 are provided, so that a force in a shearing direction is not loaded on the fiber-core conductor 21, which is connected to the terminal 4. Thus, the electric wire 2 (fiber-core conductor 21) and the terminal 4 are electrically connected to each other.

Thereafter, in condition that the fiber-core conductor 21 is passed over the end portion 7 of the pin 5, which is a far side from the head 6, the head 6 provided in the rivet 3 is pushed to terminal 4 and the end portion 7 of the pin 5, which is a far side from the head 6, is pressed by punching the end portion 7 toward the terminal 4. Thereby, the second head 11 is formed by pressing the end portion 7 so as to prevent the pin 5 from dropping out of the opening 8, and the rivet 3 is integrated with the terminal 4. Therefore, the fiber-core conductor 21 and the terminal 4 are more tightly connected by the rivet 3 (in other words, by rivet connection). Thus, the wire connection device 10 is assembled.

According to the above embodiment, the fiber-core conductor 21 is passed over the end portion 7 of the pin 5, which is the far side from the head 6, and clamped between the rivet 3 as the vis and the terminal 4. The first boundary area R1 of the pin 5 and the end portion 7, and the second boundary area R2 between the overlap portion 9 and the inner surface of the opening 8 are curved so as to eliminate the sharp corner. Thereby, the force in the shearing direction loaded on the fiber-core conductor 21 is more controlled. Therefore, reliability of electrical connection between the fiber-core conductor 21 and the terminal 4 can be improved.

According to the above embodiment, the rivet 3 as the vis is used. The present invention is limited on this case, and any member, which may be not the rivet 3, having the rod-shape pin 5, which is inserted in the opening 8 of the terminal 4, and the head 6 extending outwardly from the pin 5, can be applied.

The present inventions are described based in the embodiments as mentioned above, but the present invention is not limited in above embodiments. Various change and modifications can be made with the scope of the present invention.

REMARKS 1, 10 Wire connecting device
21 Fiber-core conductor
21A Fiber
21B Cupper (metal)
3 Rivet (vis)
4 Terminal
5 Pin
6 Head
7 End portion
8 Opening
9 Overlap portion
11 Second head
R1 First boundary area
R2 Second boundary area

The invention claimed is:

1. A wire connecting device for connecting a fiber-core conductor configured by stranding a plurality of fiber-core conductive wires, which are formed by plating a surface of a fiber with electric conductive metal, the wire connecting device comprising:
    a vis having a rod-shape pin and a head extending outwardly from the pin to be mounted at an end portion of the fiber-core conductor; and
    a plate-shape terminal connected with the vis, and having an opening, which the pin is inserted through, and an overlap portion, which the head is overlapped on;
    wherein the fiber-core conductor is clamped between the head and the overlap portion of the terminal so as to:
        connect electrically the fiber-core conductor and the terminal; and be passed over and contacting an end portion of the pin, which is a far side from the head, and wherein at least one of a first area having the pin and the end portion, and a second area having the overlap portion and an inner surface of the opening is formed into a curved surface so as to eliminate a sharp corner.

2. The wire connecting device according to claim 1, wherein in condition that the fiber-core conductor is clamped between the overlap surface and the head, an end portion of the pin, which is a far side from the head, is pressed and formed into a second head by pressing so as to prevent the pin from dropping through from the opening.

3. The wire connecting device according to claim 1, wherein the vis is formed from an electric conductive material.

4. A wire connecting device assembly comprising:

a fiber-core conductor including a plurality of fiber-core conductive wires stranded together, wherein the plurality of fiber-core wires are formed by plating a surface of a fiber with electric conductive metal;

a vis having a proximal head and a rod-shape pin depending from the head to terminate in a distal end; and a plate-shape terminal having an overlap portion defining an opening for the pin, wherein when assembled, the pin is inserted in the opening, and the fiber-core conductor extends into the opening around the distal end and is clamped between the head and the overlap portion of the terminal so as to electrically connect the fiber-core conductor and the terminal.

5. A wire connecting device assembly as recited in claim 4, wherein the distal end of the vis is rounded.

6. A wire connecting device assembly as recited in claim 4, wherein the opening is rounded between an inner surface of the opening and the overlap portion.

* * * * *